United States Patent
Stanley

(10) Patent No.: US 7,194,364 B1
(45) Date of Patent: Mar. 20, 2007

(54) METHOD OF ANALYZING A DIGITAL MEDIA BY A DIGITAL MEDIA PLAYER

(75) Inventor: Robert W. Stanley, Peru, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/331,527

(22) Filed: Jan. 13, 2006

(51) Int. Cl.
G11B 20/18 (2006.01)
G01R 29/26 (2006.01)

(52) U.S. Cl. .................... 702/69; 369/53.1

(58) Field of Classification Search ............ 702/69
See application file for complete search history.

(56) References Cited

U.S. PATENT DOCUMENTS 5,812,506 A * 9/1998 Pietrzykoski et al. .... 369/53.33
6,278,784 B1 * 8/2001 Ledermann ............. 381/58
2002/0054549 A1 * 5/2002 Ohtsu ................ 369/44.32

OTHER PUBLICATIONS

Robert Harley, "The Analog Compact Disc," dated Dec. 1994, (includes a "sidebar" review of the Clover Systems QA-101 CD Analyzer), Stereophile.com website.
Operating Manual for the Clover QA-101 Compact Disc Analyzer, Clover Systems internet website.
Description QA-101, Clover Systems internet website, Copyright 2001.

* cited by examiner

Primary Examiner—John Barlow
Assistant Examiner—Cindy D. Khuu
(74) Attorney, Agent, or Firm—Jimmy L. Funke

(57) ABSTRACT

A method of analyzing a digital media by a digital media player and displaying the condition of the digital media whether or not the player ejects the digital media, provides useful information for the end user. Preferably, an ASIC of the digital media player measures jitter, HF and BLER and inputs the measured values into a microprocessor of the player. If the measured values are greater than respective pre-established threshold values, the microprocessor tabulates and stores running averages to an electronic memory. If the running averages are excessive, the player will deliver an error message to the end user preferably on an electronic display of the digital media player.

7 Claims, 2 Drawing Sheets

METHOD OF ANALYZING A DIGITAL MEDIA BY A DIGITAL MEDIA PLAYER

FIELD OF THE INVENTION

The present invention relates to a method of analyzing a digital media and more particularly a method of analyzing a digital media by a digital media player.

BACKGROUND OF THE INVENTION

The audio compact disc player has become one of the most popular pieces of consumer electronics equipment in use today. Compared to prior audio analog electronics, the digital signal of the compact disc player does not compound noise and distortion. In digital audio signals' quality of sound is not a function of the reading mechanism nor the media (i.e. compact disc). Digital performance parameters such as frequency response, linearity, and noise are generally only functions of the digital-to-analog converter (DAC). Other influences, however, that can effect the performance of the audio compact disc player and not necessarily the quality of sound include hardware defects and the quality of the recorded digital media or compact disc (CD).

The audio CD stores about 650-MB of audio data in a standardized format. The CD consists of several stereo tracks stored using 16-bit PCM coding at a sampling rate of 44.1 kHz. Typical CDs have a diameter of 120 mm and hold 74 minutes of audio with a player scanning speed of 1.2 m/s. They are 1.2 mm thick and are made of a polycarbonate-plastic coated with a much thinner layer of super purity aluminum layer protected by a film of lacquer. The lacquer film is typically printed or silk-screened with a label. The audio CD has a 15 mm hole in the center used by some form of clamp or clip device of the audio compact disc player to hold it in place and allow it to be rotated by a servo device or motor.

The information encoded on a CD is a spiral track of "pits" molded or imprinted into the top of the polycarbonate layer with the areas between the pits called "lands." Each pit is approximately 125 nm deep by 500 nm wide, and varies from 850 nm to 3.5 μm long. The lands establish a time function for proper servo speed. The spacing between the tracks is 1.6 μm. To grasp the scale of the pits and lands of a CD, if the disc is enlarged to the size of a sport stadium, a pit would be approximately the size of a grain of sand. The spiral begins at the center of the disc and proceeds outwards to the edge, that allows different size formats (i.e. disk diameter).

The CD is conventionally read by focusing a 780 nm wavelength semiconductor laser of the player through the bottom of the polycarbonate layer. The difference in height between pits and lands is one quarter of the wavelength of the laser light, leading to a half-wavelength phase difference between the light reflected from a pit and from its surrounding land. The destructive interference thus reduces the intensity of the reflected light compared to when the laser is focused on just a land. By measuring this intensity with a photodiode, one is able to read the data from the CD. The pits and lands themselves do not represent the zeros and ones of binary data. Instead a change from pit to land or land to pit indicates a one, while no change indicates a zero. This in turn is decoded by reversing an Eight-to-Fourteen Modulation used in mastering or creating the CD, thus revealing the raw data stored on the CD.

The CD can be ruined by numerous defects including smudges, dirt and scratches. Because the pits are much closer to the label side of a CD, defects on the label are more prone to create out of focus playback, whereas defects such as scratches on the clear-side of the plastic CD can be repaired by refilling them with plastic of a similar index of refraction as the polycarbonate.

It is of little surprise that the advent of the audio CD player has been followed by commercially available audio CD burners or recorders. Such recorders utilize compact discs commonly referred to as "CD-Rs." A CD-R is physically different than a mastered CD in that they are not imprinted and do not have actual pits and lands. Instead, a CD-R is injection molded with a "blank" data spiral. A photosensitive dye is then applied, and then the discs are metallized and lacquer coated. The write laser of the CD recorder changes the characteristics of the dye to allow the read laser of the audio CD player to see the data as it would a master CD. In-other-words, the audio CD player is fooled by thinking what is read are pits and falls but in actuality the player is reading changed reflective characteristics of a dye.

Unfortunately, the likelihood that an error will occur in the audio CD player when playing a CD-R is far greater than when playing an imprinted/master CD. Such errors are the result of physical defects on the CD-R when the consumer records a CD using one or any combination of the following: substandard CD media (CD-R or CD-RW), low quality recording software, low power recording laser diode, overburning, warped CD-R, poor motor drive, etc. In addition, but less likely, is the consumer experiencing an error eject of the player from physical defects on a professionally manufactured pressed CD-DA. Regardless, even a CD-DA may be damaged with excessive dirt and scratches causing ejection of the CD from the audio CD player and leaving the end user to wonder if its the CD or the audio CD player that is defective, and creating needless warranty returns of the audio CD players that the manufacturer must then address.

Not surprisingly, applications of the audio compact disc player extend into the automotive markets. Like many other markets, the automotive industry is greatly influenced by warranty returns. If an automotive audio CD player consistently skips audio tracks, mutes audio tracks, or ejects CDs without apparent cause, the consumer or end user is likely to return the vehicle for warranty repair even if the cause is not justified and/or caused by a faulty CD and not the automotive CD player.

SUMMARY OF THE INVENTION

A method of analyzing a digital media by a digital media player and displaying the condition of the digital media should the player eject the digital media provides useful information for the end user. Preferably, an Application Specific Integrated Circuit (ASIC) of the digital media player measures jitter, high frequency signal amplitude (HF or RF) and block error rates (BLER) and inputs the measured values into a microprocessor of the player that then performs and stores to memory a running average to provide an overall quality measurement of the digital media. In the case of severe localized problems, the measured values are compared against respective pre-established threshold values. If the measured values are greater than the threshold values the microprocessor will store these values and continue to play the media if at all possible. However, if the localized problem is severe and an unreadable data condition exists, the microprocessor will send a command to the ASIC to eject the digital media. Preferably, the microprocessor also delivers an error message indicating the overall quality of the CD to the end user preferably on an electronic display of the digital media player.

The digital media player is preferably an audio compact disc player mounted in the dash of an automobile. Because temperatures fluctuate considerably in a vehicle environment and such fluctuations effect measured BLER values, the audio compact disk player preferably includes a temperature sensor that inputs a signal to the microprocessor. The temperature sensor data is intended for CD radio return warranty analysis but can be used for digital media quality functions.

Objects features and advantages of this invention include a robust audio compact disk player capable of recording to memory the condition of a CD for at least each time an audio CD player skips or a CD is unexpectedly ejected. Yet further, the end user is notified by the audio CD player as to possibly why the skipping occurred or why the CD was ejected providing the end user with needed information as to whether the player requires maintenance or repair, or whether the CD is faulty or requires cleaning. The method further reduces warranty returns on the audio CD player thus reducing manufacturer costs, is robust in principle and inexpensive to incorporate into the electronics of the audio CD player.

BRIEF DESCRIPTION OF THE DRAWINGS

The present invention will now be described, by way of example, with reference to the accompanying drawings, in which.

DETAILED DESCRIPTION OF PREFERRED EMBODIMENTS

Digital media technology, in a general sense takes an analog input signal from any number of recording devices including but not limited to microphones and video cameras. The analog signal is converted to a digital signal 22 and recorded on a digital media 20. The end user who acquires the digital media 20 can then utilize a digital media player 24 that converts the digital signal 22 as an analog output 26.

Figure 1:
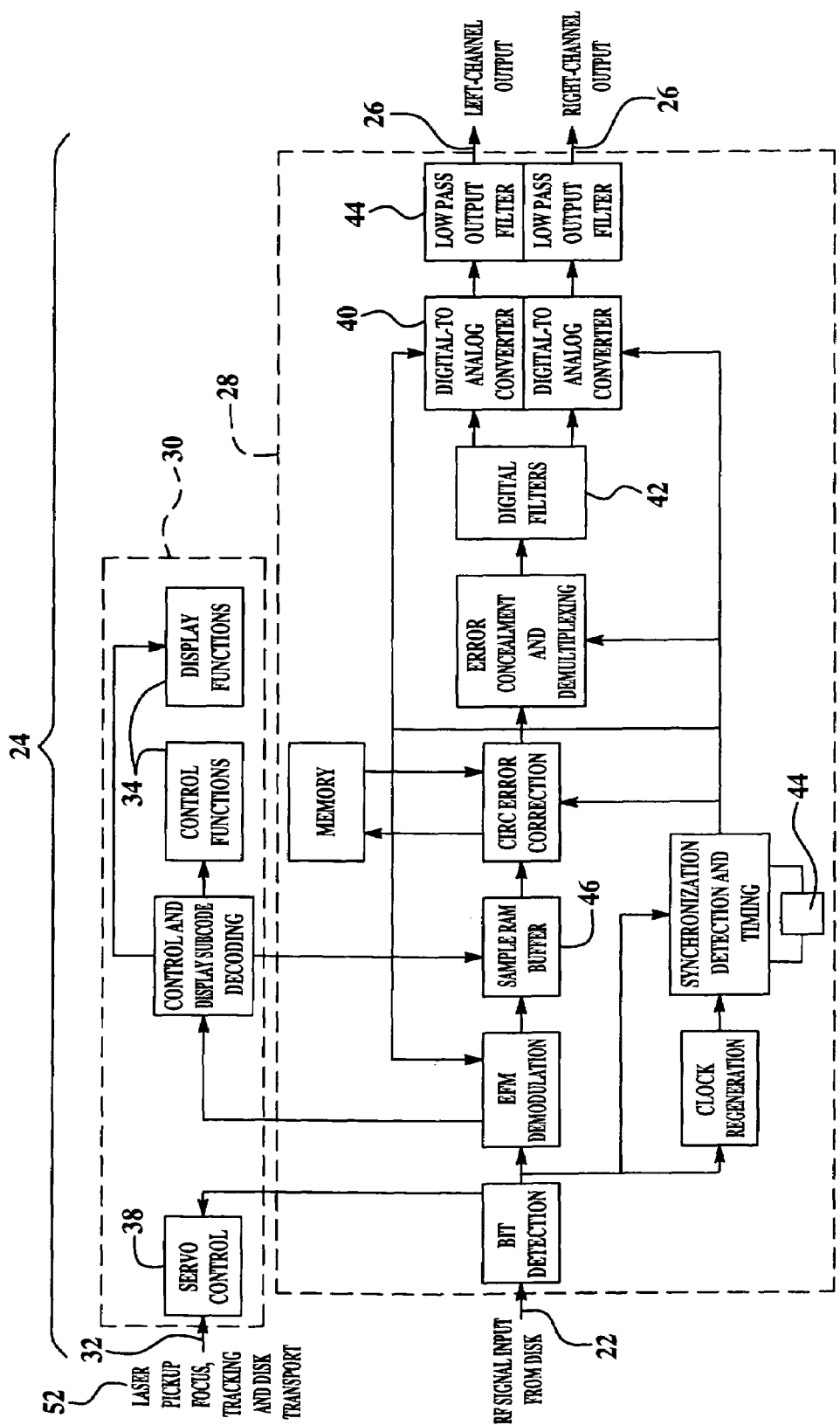
FIG. 1 is a block diagram of a digital media player of the present invention.
Figure 2:
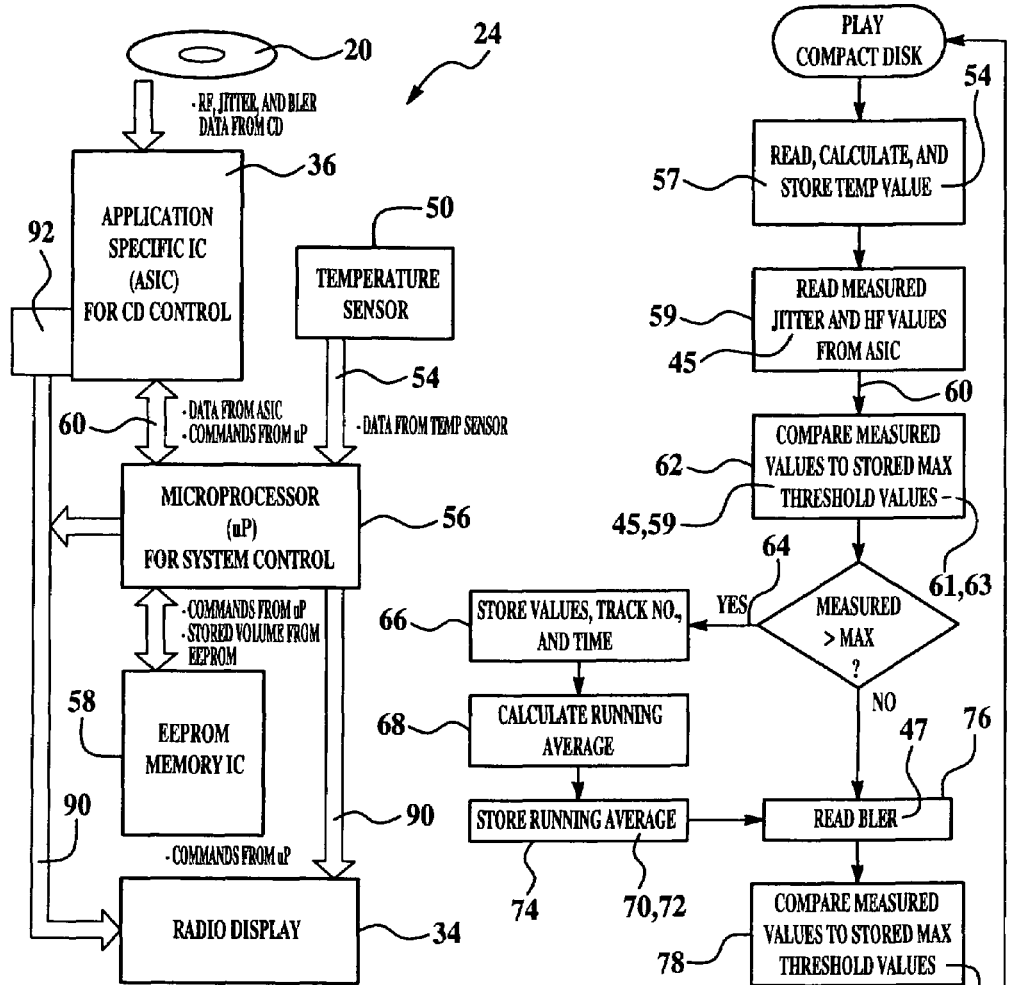
FIG. 2 is a command flowchart of a method of analyzing a digital media of the present invention utilizing the digital media player.

Referring to FIGS. 1–2, preferably and for purposes of illustration, the digital media 20 is an audio compact disc (CD). During recording, the analog input signal, typically coming from a studio microphone, is converted to digital and imprinted as such along a spiralling track of the CD as a series of pits and lands (not shown). The end user or music enthusiast utilizes an audio CD player as the digital media player 24 that converts the imprinted digital signal 22 to the analog signal or output 26 at the at least one speaker in a listening environment. The listening environment can be any environment such as the home or business, however, the preferred environment for the present application is automotive utilizing the audio CD player 24 typically mounted in the dash of a vehicle (not shown).

Referring to FIGS. 1 and 2, a block diagram of the audio CD player 24 is illustrated. Two main sub-systems generally exist, they are the audio data processing sub-system 28 and the servo, control and display sub-system 30. The servo, control, and display sub-system 30 orchestrates the mechanical operation of the audio CD player 24 and includes such items as the spindle motor, auto-tracking, lens focus 32, and the user interface 34 or radio display. Preferably, an ASIC controls the servo control 38 (not readily apparent in FIG. 1) for normal play functions. However, if control is lost (i.e. power failure) servo recovery is performed from a microprocessor 56 by sending recovery commands to the ASIC 36. The audio data processing sub-system 28 covers all other player processes.

The audio data processing sub-system 28 of the audio CD player 24 generally utilizes a low-bit digital-to-analog converter (DAC) 40 along with oversampling filters 42 and preferably a gentle analog output filter 44. At the digital hardware level, DAC's may be designed in any variety of ways generally known in the art. For purposes of audio reproduction, however, sixteen to twenty-bit converters or greater are preferred. However, for audio applications, DAC's of greater than twenty bits are needlessly expensive and current CD system sampling rates can not use these extra bits. In contrast, digital video medias or DVD's as an alternative digital media generally require DAC's of greater than twenty bits.

Figure 3:
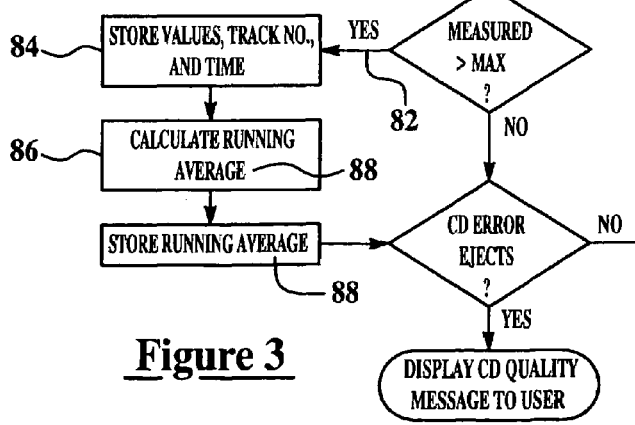
FIG. 3 is a logic flowchart of the method of analyzing a digital media.

Referring to FIGS. 1–3, one type of sound distortion when converting from digital-to-analog (i.e. playing the audio CD) is known as "jitter" that is basically defined as time instability. Jitter 45 occurs in the audio compact disc player 24 when samples are being read off the CD 20. There are two types of jitter 45 in a CD system; jitter caused by the CD electronics and jitter caused by the pits and lands on the CD 20 itself from a poor recording process (i.e. stamping or burning). Pertaining to electronics jitter, samples read from the CD 20 are controlled by the pulses of a crystal oscillator 44. If the system clock pulses inaccurately, if there is a glitch in the digital hardware, or if there is noise on a signal control line, the actual reading time will vary from sample to sample thus inducing noise and distortion in extreme cases.

Jitter contributable by the hardware/player is generally overcome in quality systems by having the samples read off the CD 20 into a RAM buffer 46. As the buffer becomes full, the crystal oscillator can then "clock-out" the samples in a reliable manner, independent of the transport and reading mechanisms. This process is referred to as time-base correction. Typically, electronic jitter created by the crystal oscillator is generally negligible because of the internal ASIC RAM buffer 46. Excessive jitter and particularly CD jitter caused by poor CD recording processes can cause interruption of the sound quality or ejection of the CD 20 from the player 24.

BLER 47 is the number of data blocks per second that contains detectable errors. It is generally not a contributing factor to the system's ability to play the CD 20. BLER 47 is a data point measurement among many factors to determine the overall quality of the CD 20. Causes for high BLER rates can include one or all of the following: improper HF amplitude, high jitter, fingerprints, smudges, or scratches.

A temperature sensor 50 of the audio CD player 24 adds an extra piece of data to the CD analyzer's capabilities. CD playability is largely limited to two factors: the quality of the CD 20 being played and the hardware's optical pickup unit (OPU) 52. Due to the OPU's physical characteristics and associated tolerances dependent on high temperature 54, jitter 45 and BLER 47 may increase with high temperature when mechanical components shift; reducing the HF laser light signal back for decoding. The reduction in HF signal 22 strength or integrity lowers the overall ability of the ASIC 36 to overcome other playability issues from scratches, smudges, and poorly recorded CD media 20. The temperature sensor 50 will typically not introduce error. Providing temperature sensor data 54 in addition to jitter and BLER data 45, 47 will give a more accurate overall system condition during an audio interruption event if the system is returned for warranty analysis to determine "root cause"; OPU stress or CD quality. For example, a scratched CD 20 that creates many BLER's may play fine at room temperature but fails (many audio interruptions) at high temperature due to the OPU stress factors mentioned above.

Moreover, measuring temperature before jitter is preferred because of the large impact temperature has on the OPU 52 and thus jitter 45. For example, when an automotive radio having the audio CD player 24 is utilized in a hot and harsh desert environment without playing the CD 20, the internal temperature around the OPU can still increase. When a CD 20 is inserted for play, jitter data 45 may not be available if the OPU 52 is badly damaged. Consequently, measuring temperature data 54 first will give clues during warranty analysis.

Referring to FIGS. 2 and 3, in operation the end user inserts the recorded digital media or CD 20 into the electronic or digital media player or audio compact disc player 24. The temperature sensor 50 of the disc player 24 inputs temperature data 54 into a microprocessor or integrated circuit 56 that stores 57 the temperature data 54 to memory or EEPROM 58. The ASIC 36 then simultaneously measures 59 jitter and HF values 45, 59 and inputs 60 the measured values into the microprocessor 56. The microprocessor 56 compares 62 the measured values of jitter and HF 45, 59 to pre-established/stored maximum threshold, respective, values of jitter and HF 61, 63.

If either the measured values of jitter and/or HF exceed 64 the maximum threshold values 61, 63, the measured values 45, 59 are stored 66 along with the coinciding track number or media location identifier and time. This process is generally iterative and the microprocessor 56 thus calculates running averages 70, 72 of measured values 45, 59 that exceed the respective threshold values 61, 63. The respective running averages 70, 72, of jitter and of HF are stored 74 to memory 58.

If the measured jitter and measured HF 45, 59 do not exceed the respective threshold values 61, 63 or after storing 74 the running averages 70, 72 of jitter and HF, the microprocessor 56 reads 76 the BLER value 47, measured by and received from the ASIC. The microprocessor 56 compares 78 the measured BLER value 47 to a stored BLER maximum threshold value 80. If the measured BLER value 47 exceeds 82 the maximum BLER threshold value 80, the microprocessor 56 stores 84 the measured value along with the track location or number and time. This process is iterative, thus the microprocessor 56 calculates 86 a running average 88 of all measured BLER values 47 that exceed the threshold.

BLER is generally a measured value per second. The BLER threshold value 80 is required because even CD's that play fine have BLER values in the hundreds. Thus, to determine a running average of all BLER values would quickly overrun the EEPROM memory allocations, hence the need for the empirically determined BLER threshold value. Of course, should memory costs decrease, reducing the BLER threshold value or eliminating the threshold altogether would be feasible.

Typically, if BLER, jitter and/or HF values 47, 45, 59 analyzed by the microprocessor 56 are excessive, the microprocessor commands the ASIC 36 to skip over a section of the CD 20 and/or eject the CD from the player 24. If the respective running averages of BLER and jitter 88, 70 analyzed by the microprocessor 56 are uniquely excessive (as determined empirically), the microprocessor also delivers a signal to the radio display 34 that provides a CD quality message 90 to the end user. Of course if the microprocessor evaluates running averages that are not excessive, the audio CD player 24 will continue to run, and the running averages 70, 72, 88 will continue to be calculated.

The overall CD quality message is preferably displayed on the audio CD player 24 itself, and upon user request by preferably pressing a pushbutton 92 or combination of pushbuttons. Alternatively, an onboard communication bus can provide a serviceman access to read stored values from a remote diagnostic tool (not shown).

Although the preferred embodiment of the present invention has been disclosed, various changes and modifications can be made by one skilled in the art without departing from the scope and spirit of the invention as set forth in the appended claims. For instance, the digital media need not be limited to audio but may include visual media or any other application capable of recordation. Furthermore, it is understood that the terms used here are merely descriptive rather than limiting and various changes may be made without departing from the scope and spirit of the invention.

The invention claimed is:

1. A method of analyzing a digital media utilizing a digital media player, the method comprising the steps of:
    inserting the digital media into the digital media player;
    playing the digital media;
    measuring a temperature in the digital media player;
    measuring a diagnostic value by an ASIC of the digital media player, wherein the diagnostic value is one of a block error rates (BLER) value, a high frequency signal amplitude (HF) value and a jitter value;
    comparing the measured diagnostic value to a stored maximum threshold value by a microprocessor of the digital media player; and
    if the measured diagnostic value is greater than the threshold value:
    (1) storing the measured diagnostic value and the measured temperature as well as a media location identifier and a time into memory of the microprocessor;
    (2) calculating and storing a running average of the measured diagnostic value; and
    (3) displaying a digital media quality message to an end user.

2. The method of analyzing a digital media set forth in claim 1 wherein the digital media is a compact disc, the media location identifier is a track location and the digital media player is an automotive audio compact disc player.

3. The method of analyzing a digital media set forth in claim 1 comprising the further step of continuing to play the digital media if the running average of the measured diagnostic value remains less than the threshold value.

4. The method of analyzing a digital media set forth in claim 3 comprising the further step of actuating one actuator on the digital media player by the end user to display the digital media quality message.

5. The method of analyzing a digital media set forth in claim 4 wherein step of actuating one actuator comprises depressing at least one button.

6. The method of analyzing a digital media set forth in claim 1 wherein the digital media is a compact disc, the digital media player is a compact disc player, the media location identifier is a track number and the measured diagnostic value is a BLER value.

7. The method of analyzing a digital media set forth in claim 1 further comprising the step, if the measured diagnostic value is greater than the threshold value:
    (4) ejecting the digital media from the digital media player, wherein the displayed digital media quality message indicates that the digital media quality is the reason for the ejection.

* * * * *